(12) United States Patent
Hueting et al.

(10) Patent No.: US 6,515,348 B2
(45) Date of Patent: Feb. 4, 2003

(54) SEMICONDUCTOR DEVICE WITH FET MESA STRUCTURE AND VERTICAL CONTACT ELECTRODES

(75) Inventors: Raymond J. E. Hueting, Helmond (NL); Erwin A. Hijzen, Blanden (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/851,441

(22) Filed: May 8, 2001

(65) Prior Publication Data

US 2001/0040273 A1 Nov. 15, 2001

(30) Foreign Application Priority Data

May 10, 2000 (GB) .............................. 0011160
May 23, 2000 (GB) .............................. 0012285

(51) Int. Cl.[7] .................. H01L 27/76; H01L 29/94; H01L 31/062; H01L 31/113; H01L 31/119
(52) U.S. Cl. .................. 257/623; 257/330; 257/332; 257/342; 257/347; 257/622; 257/624
(58) Field of Search .................. 257/330–332, 257/342–347, 622–624

(56) References Cited

U.S. PATENT DOCUMENTS

| 4,336,549 A | | 6/1982 | Ladd ........................... 357/15 |
| 4,835,584 A | | 5/1989 | Lancaster ...................... 357/23 |
| 4,996,574 A | | 2/1991 | Shirasaki ..................... 357/23.7 |
| 5,072,276 A | * | 12/1991 | Malhi et al. ................... 357/42 |
| 5,115,289 A | | 5/1992 | Hisamoto et al. ............. 357/23.7 |
| 5,264,713 A | * | 11/1993 | Palmour ........................ 257/77 |
| 5,382,814 A | * | 1/1995 | Ashley et al. ................. 257/197 |
| 5,391,506 A | | 2/1995 | Tada et al. ..................... 437/41 |
| 5,451,800 A | * | 9/1995 | Mohammad ................. 257/191 |
| 5,506,421 A | * | 4/1996 | Palmour ........................ 257/77 |
| 5,932,911 A | | 8/1999 | Yue et al. ...................... 257/330 |
| 6,104,061 A | * | 8/2000 | Forbes et al. ................. 257/330 |
| 6,294,418 B1 | * | 9/2001 | Noble ............................ 438/212 |

* cited by examiner

*Primary Examiner*—Jerome Jackson
*Assistant Examiner*—Jesse A Fenty
(74) *Attorney, Agent, or Firm*—Steven R. Biren

(57) ABSTRACT

A semiconductor device comprises one or more field effect devices (FD) having source and drain regions (5 and 6) spaced apart by a body region (3*a*). A gate structure (7*a*, 7*b*), preferably in a trench (4), controls a conduction channel in a portion (3*b*) of the body region (3*a*) between the source and drain regions. The device has one or more mesa structures (100) having end and side walls (100*a* to 100*d*). The body region (3*a*) extends between and meets at least the side walls (100*c* and 100*d*) of the mesa structure. The gate structure (7*a*, 7*b*) extends along and between the side walls such that the conduction channel accommodating portion (3*b*) extends along and between the side walls (100*c* and 100*d*). The source and drain regions (5 and 6) meet respective end walls (100*a* and 100*b*) of the mesa structure and/or its side walls (100*c* and 100*d*). At the mesa walls, a source electrode (S) contacts the source region (5) and a drain electrode (D) contacts the drain region (6). (FIGS. 12 and 13)

20 Claims, 6 Drawing Sheets

SEMICONDUCTOR DEVICE WITH FET MESA STRUCTURE AND VERTICAL CONTACT ELECTRODES

This invention relates to a semiconductor device comprising a field effect device having a gate structure.

In particular, the present invention relates to a semiconductor device comprising a semiconductor body comprising a field effect device wherein the semiconductor body has source and drain regions spaced apart by a body region, a source electrode contacts the source region and a drain electrode contacts the drain region, and a gate structure is provided for controlling a conduction channel in a conduction channel accommodation portion of the body region extending between the source and drain regions.

U.S. Pat. No. 4,835,584 describes a field effect transistor in which the source, gate structure and drain are formed within a trench in a semiconductor substrate. In this transistor, the gate width (where, as is understood in the art, the gate width is the dimension perpendicular to the flow of current through a conduction channel controlled by the gate, and the gate length is the dimension parallel to the flow of current through the conduction channel) is determined by the depth of the trench and can be increased substantially without increasing the surface area occupied by the transistor. This enables a transistor having a good conduction channel length to width ratio and so a low on-resistance (Rdson), good current handling capabilities and gain to be provided. However, increasing the trench depth for a given trench area (so as to increase the gate width) increases the aspect ratio and makes it more difficult to deposit metallisation to form the source and drain electrodes and may lead to increased source and drain resistance.

It is an aim of the present invention to provide a semiconductor device comprising a field effect device that overcomes or at least mitigates the abovementioned problems.

Advantageous technical features in accordance with the present invention are set out in the appended claims.

In one aspect, the present invention provides a semiconductor device comprising a semiconductor body comprising a field effect device, the semiconductor body having source and drain regions spaced apart by a body region, the field effect device having within a trench (having end, side and bottom walls) a gate structure for controlling a conduction channel in a conduction channel accommodation portion of the body region between the source and drain regions, wherein the field effect device is provided as a mesa structure having end and side walls, the source and drain regions meet respective end walls of the mesa structure, a source electrode contacts the source region and a drain electrode contacts the drain region, and the conduction channel accommodation portion extends between the source and drain regions and along one trench side wall, along the trench bottom wall and along the other trench side wall.

In another aspect, the present invention provides a semiconductor device comprising a semiconductor body comprising a field effect device, the semiconductor body having source and drain regions spaced apart by a body region, the field effect device having a gate structure for controlling a conduction channel in a conduction channel accommodation portion of the body region between the source and drain regions, wherein the field effect device is provided as a mesa structure having end and side walls and a top, the source and drain regions meet respective end walls of the mesa structure and are separated by a portion of the mesa structure forming the body region and meeting the top and the side walls of the mesa structure, a source electrode contacting the source region, and a drain electrode contacting the drain region, and the gate structure extends on the surfaces of the body region so that the conduction channel accommodation portion extends along one side wall, the top and the other side wall.

In yet another aspect, the present invention provides a field effect device formed as a mesa structure with source and drain regions at opposite ends of a trench formed in the mesa structure, a gate structure provided within the trench to control a conduction channel between the source and drain regions, and source and drain electrodes contacting respective parts of the source and drain regions that meet end and/or side walls of the mesa structure so that the source and drain electrodes extend partly along the end and/or side walls of the mesa structure. A series of alternating source and drain regions may be provided along the length of the mesa structure. In this case, the respective field effect devices may be connected in parallel to provide a higher power, parallel cell device. Thus, conductive connections outside the mesa may respectively connect the source regions in parallel and the drain regions in parallel.

Providing the field effect device as a mesa structure with the source and drain electrodes contacting portions of the source and drain regions exposed at walls of the mesa structure enables the mesa structure to be relatively deep, while still achieving good contact to the source and drain regions. This allows a large increase in gate width enabling a low on-resistance (Rdson) and good current carrying capabilities and gain to be achieved, without detrimentally increasing source or drain resistance. A compact device structure can be achieved by providing the gate structure in a trench that has side walls parallel to the side walls of the mesa structure.

When the gate structure is provided within a trench in the mesa structure, the present invention readily permits the side walls of the mesa structure (with source and drain regions) that are contacted by the source and drain electrodes to be deeper than the side walls of the trench (and so deeper than the depth of the conduction channel controlled by the gate). This depth relation of trench and mesa structure permits a more uniform current flow from the conduction channel to the source and drain regions and their electrodes, and so reduces the spreading resistance. As a result an even lower on-resistance (Rdson) is possible when this depth relationship is adopted in accordance with the invention.

The total semiconductor device may comprise a plurality of the mesa structures located side-by-side, with the field effect devices of the respective mesa structures connected in parallel to provide a higher power, parallel cell device.

Embodiments of the present invention will now be described, by way of example, with reference to the accompanying diagrammatic drawings, in which.

It should be noted that the Figures are diagrammatic, relative dimensions and proportions of parts having been shown exaggerated or reduced in size for the sake of clarity and convenience. The same reference signs are generally used to refer to corresponding or similar features in the different embodiments.

Figure 1:
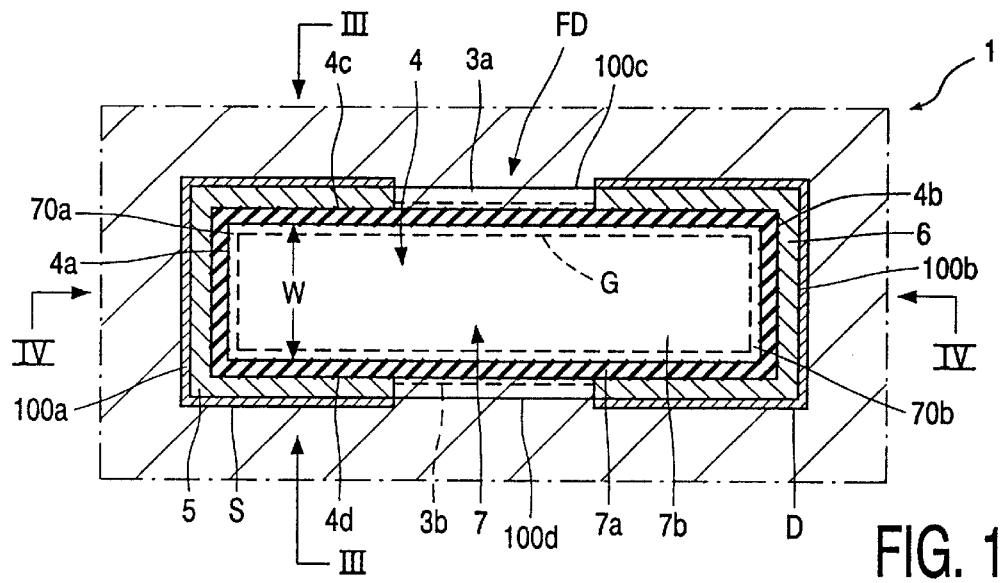
FIG. 1 shows a diagrammatic top plan view of an embodiment of a semiconductor device in accordance with the present invention.
Figure 2:
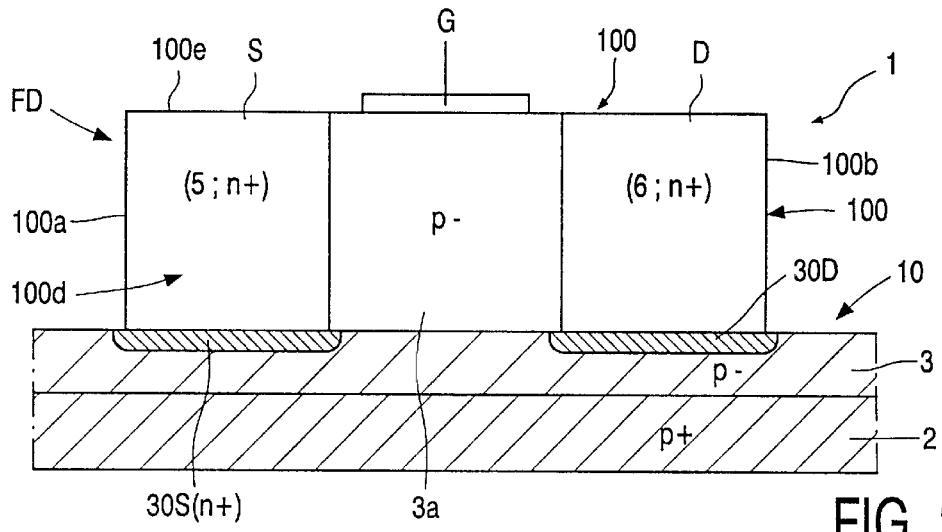
FIG. 2 shows a part-sectional side elevational view of the semiconductor device shown in FIG. 1.
Figure 3:
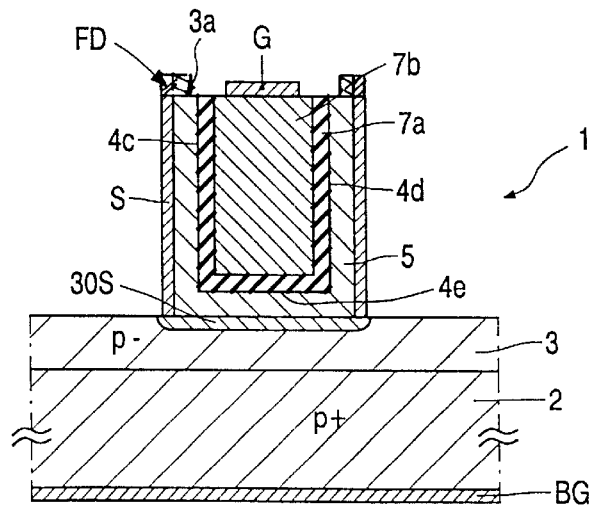
FIG. 3 shows a cross-sectional view taken along line III—III in FIG. 1.

FIGS. 1 to 3 illustrate an embodiment of a semiconductor device 1 in accordance with the invention. FIG. 1 shows a top plan view while FIG. 2 shows a side elevational view and FIG. 3 shows a cross-section taken along line III—III in FIG. 1 of the semiconductor device.

The semiconductor device 1 comprises a semiconductor body 10 comprising at least one field effect device FD. The device is an insulated gate field effect transistor (i.e. a MOSFET). The semiconductor body 10 comprises a substrate 2 which, in this example, is a silicon substrate which is relatively highly doped with p conductivity type impurities, typically boron. Typically, the dopant concentration is $1 \times 10^{19}$ cm$^{-3}$. The thickness of the substrate may be in the range of from 250 to 750 micrometers.

The substrate 2 carries a silicon epitaxial layer 3 which is relatively lowly doped with p conductivity type impurities. Typically the dopant concentration is $1 \times 10^{16}$ cm$^{-3}$ to $2 \times 10^{17}$ cm$^{-3}$ and the thickness of the epitaxial layer is at least 0.6 micrometers. The epitaxial layer 3 carries a mesa structure 100 in which the field effect device FD is defined. In this example the mesa structure is a right parallelopiped having end walls 100a and 100b, side walls 100c and 100d and a top surface 100e.

As can be seen from FIGS. 1 and 3, a trench or opening 4 extends into the mesa structure 100 from the top surface 100e. In this example the trench is also of right parallelopipedal form having end walls 4a and 4b, side walls 4c and 4d and a bottom wall or surface 4e. As illustrated in FIG. 3, the side walls 100c and 100d of the mesa structure 100 are deeper than the side walls 4c and 4d of the trench 4.

Source and drain regions 5 and 6 of n conductivity type are provided at respective ends of the mesa structure 100. Typically the source and drain regions 5 and 6 have a dopant concentration of $1 \times 10^{19}$ cm$^{-3}$ and a thickness (or lateral depth) of 0.3 micrometers. The source region 5 extends along the end wall 4a and along a portion of each of the side walls 4c and 4d and the bottom wall 4e adjacent the end wall 4a of the trench 4. The source region 5 meets the end wall 100a and corresponding portions of the side walls 100c and 100d of the mesa structure 100. The drain region 6 similarly extends along the end wall 4b and along a portion of each of the side walls 4c and 4d and the bottom wall 4e adjacent the end wall 4b of the trench 4 and meets the end wall 100b and corresponding portions of the side walls 100c and 100d of the mesa structure 100. Where the source and drain regions 5 and 6 meet the side walls 100c and 100d, they extend vertically over the whole depth of these side walls of the mesa structure. Thus each of the source and drain regions 5 and 6 has a shape corresponding to the base and three side walls of a rectangular box.

To avoid shorting of the source and drain regions to the body region, n+ conductivity type regions 30S and 30D having a depth of, typically, 0.3 micrometers are provided in the epitaxial layer beneath the source and drain regions 5 and 6, as shown in FIGS. 2 and 3.

The portion 3a of the mesa structure 100 between the source and drain regions 5 and 6 consists of p conductivity type material of similar doping concentration to the epitaxial layer 3, and in this example it has a shape defining part of a bottom wall and each of two side walls of a box. As will be explained below, the portion 3a may be provided by the epitaxial layer 3. The portion 3a of the mesa structure provides a transistor body region that spaces apart the source and drain regions 5 and 6.

An insulated gate structure 7a, 7b is provided within the trench 4. The insulated gate structure comprises a gate dielectric layer 7a (generally a thermal silicon oxide layer where the semiconductor device is a silicon device) covering the walls 4a to 4e of the trench and a gate conductive region 7b which in this embodiment substantially fills the trench 4 to give the mesa structure 100 a planar top surface 100e filling the trench. In this embodiment, the gate conductive region 7b is formed of doped polycrystalline silicon. The insulated gate structure 7a, 7b defines a conduction channel accommodation portion 3b extending between the source and drain regions 5 and 6 and along one trench side wall 4c, along the trench bottom wall 4e and along the other trench side wall 4d.

As shown, the source and drain regions 5 and 6 surround their respective ends 70a and 70b of the gate structure 7a, 7b.

As shown in FIGS. 1 to 3, source and drain electrodes S and D are provided so as to make ohmic contact with the source and drain regions 5 and 6, respectively. As shown in FIG. 3 and in phantom lines in FIG. 1, a gate electrode G makes ohmic contact with the gate conductive region 7b. As shown in FIG. 3, a back gate electrode BG makes ohmic contact with the substrate 2.

Where the field effect device is a discrete device, then these electrodes S, D, & G may, as is known in the art, enable electrical coupling to other discrete devices. Particular embodiments of the coupling of a plurality of the field effect devices to form a higher power multi-cellular device in the semiconductor body 10 will be described later with reference to FIGS. 12 to 14. Other semiconductor devices may be integrated in the same semiconductor body with the field effect device, in which case the electrodes may form parts of conductive tracks providing electrical coupling to the other devices integrated in the same semiconductor body.

The source and drain electrodes S and D may contact all parts of the source and drain regions 5 and 6, respectively, exposed at surfaces of the mesa structure. Thus, as shown in FIG. 1, the source electrode S extends along the end wall 100a, and along parts of the side walls 100c and 100d and the top wall 100e of the mesa structure adjacent the end wall 100a. Similarly, the drain electrode D extends along the end wall 100b, and along parts of the side walls 100c and 100d and the top wall 100e of the mesa structure adjacent the end wall 100b. The source and drain electrodes terminate at or just inside edges of the source and drain regions 5 and 6.

The provision of the field effect device as a mesa structure with the source and drain electrodes S and D contacting parts of the source and drain regions exposed at walls of the mesa structure enables the trench 4 in which the gate structure 7a, 7b is formed to be deep while still achieving good contact to the source and drain regions. This allows a large increase in gate width enabling a low on-resistance (Rdson) and good current carrying capabilities and gain to be achieved, without detrimentally increasing source or drain resistance. The spreading resistance from the source and drain electrodes S and D to the conduction channel is reduced to an ideal state by the electrodes S and D contacting the source and drain regions 5 and 6 over a greater depth (the whole depth of the walls 100a to 100d) than the depth of the gate trench 4.

For example, the trench 4 will have a depth DP of 2.3 micrometers ($\mu$m), a width W of 2.3 micrometers and a length L of 6 micrometers. For such a device, then in the ideal case of FIGS. 1 to 3 the on-resistance Rdson is given by:

$$Rdson = Vds/[Jds*(2DP+W)]*W*L$$

Where

Jds is the current density per unit length (A/$\mu$m) and $$Jds = (\mu\beta)/(tox*Lch)*[(Vg-Vt)Vd-Vd*Vd/2]$$

Where $\mu$ is the mobility (e.g. here 800 cm$^2$/Vs for silicon), Vg, Vd and Vt are the gate, drain and threshold voltages and tox is the gate dielectric thickness which may, typically, be 50 nm (nanometers).

For Vg=5 volts, Vt=1.5 volts and Vd+0.5 volts, Jds=6.5 . 10$^{-4}$ A/$\mu$m and with the trench dimensions given above Rdson=1.5 milliohms mm$^2$.

One example of a method for manufacturing the semiconductor device shown in FIG. 1 will now be described with reference to FIGS. 4 to 7.

Figure 4:
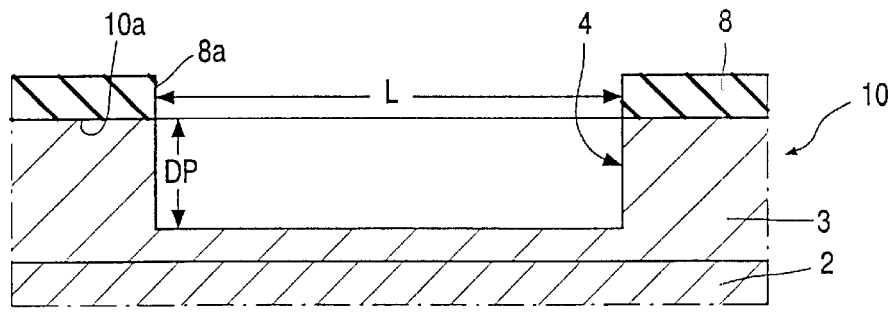
FIGS. 4 to 7 show cross-sectional views taken along the direction of line IV—IV in FIG. 1 at various stages during one example of a method of manufacturing the semiconductor device shown in FIG. 1.

FIG. 4 shows, in a cross-sectional view similar to FIG. 1, a semiconductor body consisting of a substrate 2 and an epitaxial layer 3. A mask 8 is provided on a top surface 10a of the semiconductor body 10 having a window 8a over the area where the trench 4 is to be formed. The mask 8 may be, for example, a silicon oxide mask or any other hard mask or a photosensitive resist mask.

The epitaxial layer 3 is etched using a conventional anisotropic etching process define the trench 4 having a depth DP, a width W and a length L.

The source and drain regions 5 and 6 separated by the body region 3a are then provided. The source and drain regions 5 and 6 may be provided by masking the area where the body region 3a is required with the mask 8 still in place and then introducing dopants into the exposed areas of wall of the trench 4. As a result, the source and drain regions 5 and 6 are formed by overdoped regions of the epitaxial layer 3 bounding the trench, and the body region 3a is provided by the parts of the epitaxial layer 3 bounding the trench 4 that are masked during this doping process. Where this technique is used, then the dopant may be introduced by implantation of ions, for example phosphorus ions, of the appropriate energy or be diffusion using POCl. As another possibility selective growth techniques may be used to form the source, drain and body regions 5, and 3a on the walls of the trench 4. In this case the size of the trench should be selected so as to provide the required channel dimensions once the selective deposition has been carried out. The regions 30 may be provided by out-diffusion of dopants from the source and drain regions 5 and 6.

Figure 5:
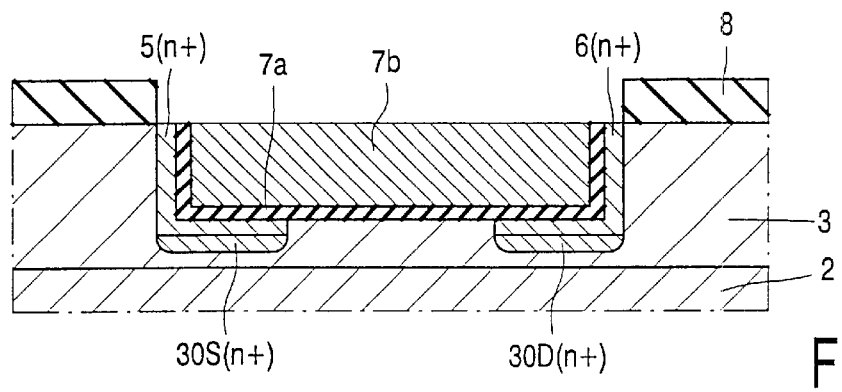

After the source, drain and body regions have been formed, a thermal oxide layer is grown to provide the gate dielectric layer 7a. Then doped polycrystalline silicon is deposited on to the gate dielectric layer 7a to form the gate conductive region 7b as shown in FIG. 5.

Figure 6:
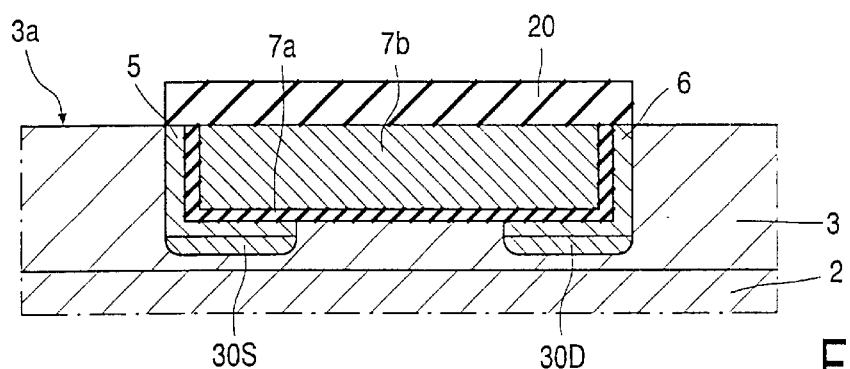
Figure 7:
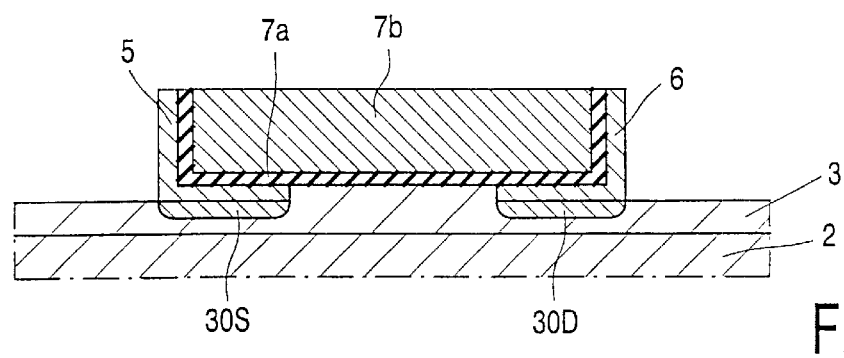

As shown in FIG. 6, a mask 20 is then provided over the area where the mesa structure 100 is to be formed, and conventional anisotropic etching techniques are used to define the mesa structure 100. Dopants may be introduced into the exposed surface areas of the mesa structure to enable good ohmic contact to the subsequent source and drain metallisation. At this stage the structure shown in FIG. 7 is formed. Thereafter, metallisation, for example aluminium, copper, titanium or titanium-tungsten or a combination of different metal layers or alloys, is deposited and patterned to provide the source, drain and gate electrodes S, D and G, and metallisation is deposited on the exposed surface of the substrate 2 to form the back gate electrode.

Figure 8:
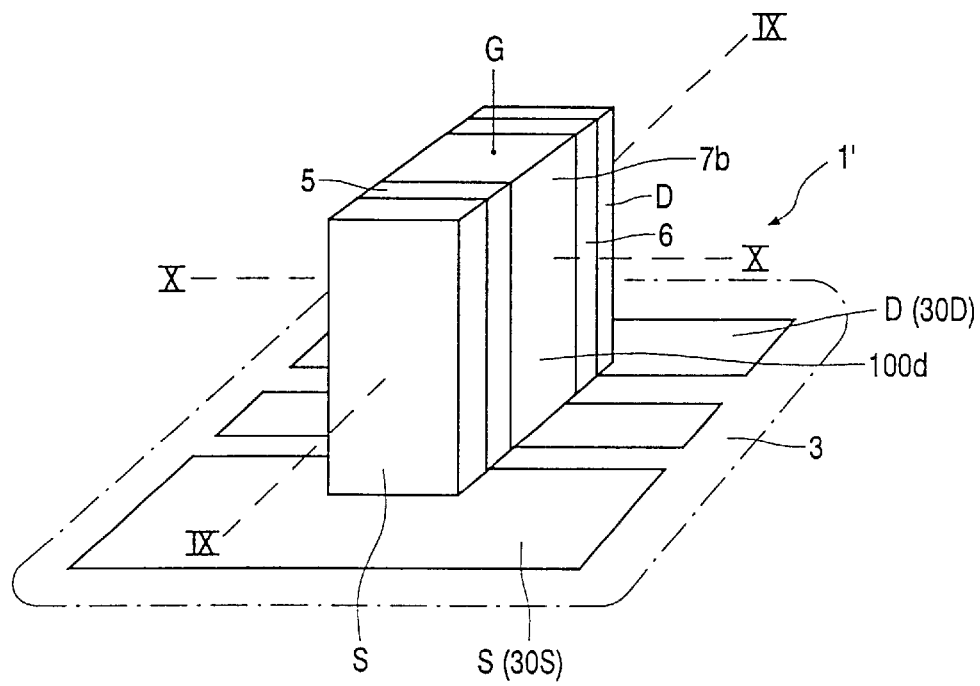
FIG. 8 shows a diagrammatic perspective view of another embodiment of a semiconductor device in accordance with the present invention.
Figure 9:
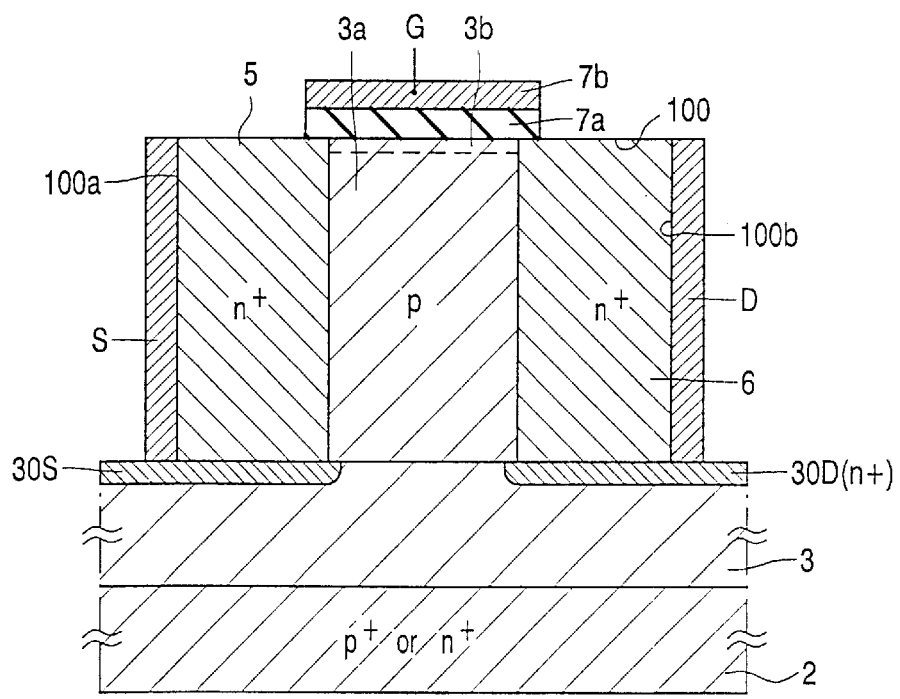
FIG. 9 shows a cross-sectional view taken along IX—IX in FIG. 8.
Figure 10:
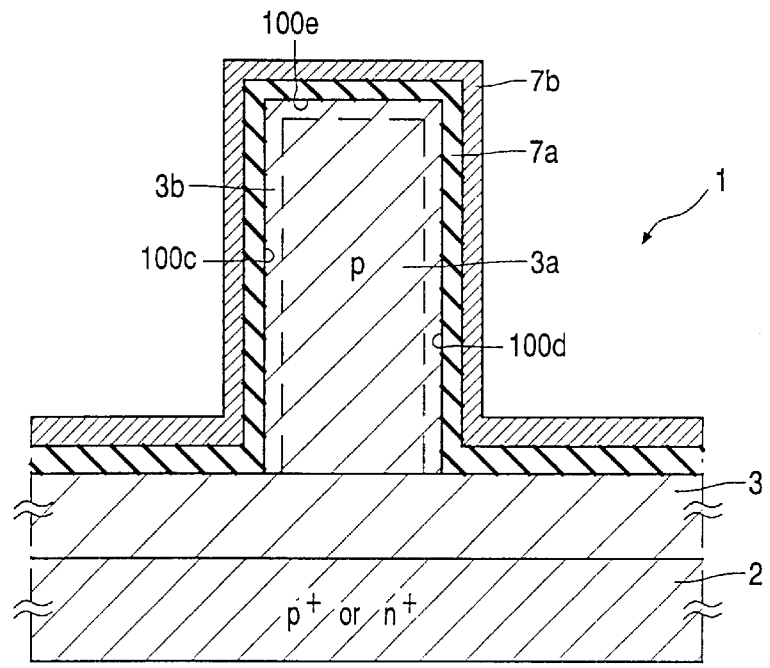
FIG. 10 shows a cross-sectional view taken along X—X in FIG. 8.

FIGS. 8 to 10 illustrate another embodiment of a semiconductor device 1' in accordance with the invention. FIG. 8 shows a diagrammatic perspective view while FIG. 9 and 10 show cross-sectional views taken along lines IX—IX and X—X in FIG. 8.

The semiconductor device 1' comprises a semiconductor body 10 comprising at least one field effect device FD. The semiconductor body 10 comprises a substrate 2 (in this example, a silicon substrate) which is relatively highly doped with p conductivity type impurities, typically boron. The substrate 2 carries a silicon epitaxial layer 3 which is relatively lowly doped with p conductivity type impurities. The dopant concentrations and the thickness of the epitaxial layer may be as described above. The epitaxial layer 3 again carries a mesa structure 100 having end walls 100a and 100b, side walls 100c and 100d and a top surface 100e.

Source and drain regions 5 and 6 of n conductivity type are again provided at respective ends of the mesa structure 100. The source and drain regions 5 and 6 may have the dopant concentrations and thicknesses or depths given above. The source region 5 meets one end wall 100a and a portion of each of the side walls 100c and 100d, as in the previous embodiment. The drain region 6 meets the end wall 100b and a portion of each of the side walls 100c and 100d, as in the previous embodiment.

The portion 3a of the mesa structure 100 between the source and drain regions 5 and 6 consists of p conductivity type material of similar doping concentration to the epitaxial layer 3 so as to meet the top wall 100e and the portions of the side walls 100c and 100d between the source and drain regions. The portion 3a of the mesa structure provides a body region spacing apart the source and drain regions 5 and 6.

An insulated gate structure 7a, 7b extends over the portions of the body region 3a meeting the mesa structure side and top walls 100c, 100d and 100e. The insulated gate structure comprises a gate dielectric layer 7a (generally a thermal silicon oxide layer where the semiconductor device is a silicon device) and a gate conductive region 7b. In this embodiment, the gate conductive region 7b is formed of doped polycrystalline silicon. The insulated gate structure 7a, 7b defines a conduction channel accommodation portion 3b extending between the source and drain regions 5 and 6 and along one side wall 100c, along the top wall 100e and along the other side wall 100d of the mesa structure.

As shown in FIGS. 8 to 10, source and drain electrodes S and D are provided so as to make ohmic contact with the source and drain regions 5 and 6, respectively over the whole depth of the mesa structure 100. A gate electrode G makes ohmic contact with the gate conductive region 7b. Although not shown, a back gate electrode may be provided making ohmic contact with the substrate 2.

Where the field effect device is a discrete device, then the electrodes S,D and G may, as is known in the art, enable electrical coupling to other discrete devices. If other semiconductor devices are integrated in the same semiconductor body with the field effect device then the electrodes may form parts of conductive tracks providing electrical coupling to the other devices integrated in the same semiconductor body.

The source and drain electrodes S and D may, as shown, extend only over the entirety of their respective end walls 100*a* and 100*b* or may extend also onto the side walls 100*c* and 100*d*. The source and drain electrodes may terminate slightly above the bottom of the mesa structure so that they do not contact the epitaxial layer 3. As another possibility, as discussed above, respective n+ conductivity type regions 30 may be formed below the source and drain regions 5 and 6 by, for example, out-diffusion of impurities or dopants from the source and drain regions 5 and 6 to avoid shorting of the source and drain electrodes S and D to the body region.

N conductivity type impurities may also be implanted after definition of the gate structure and before formation of the source and drain electrodes S and D to extend, as shown in FIG. 9, the n+ conductivity type regions 30 beyond the area immediately beneath the source and drain regions so enabling, as shown in FIG. 8, the source and drain electrodes S and D, as well as the gate electrode G, to extend from the mesa structure 100 over the surrounding portion of the layer 3, facilitating connection by conductive tracks to other devices formed in or on the same semiconductor body. A similar provision may be made in the embodiment of FIGS. 1 to 3. Where a source-body body short is required, then the n+ conductivity type region 30 beneath the source electrode S may be replaced by a p+ conductivity type region 30.

Figure 11:
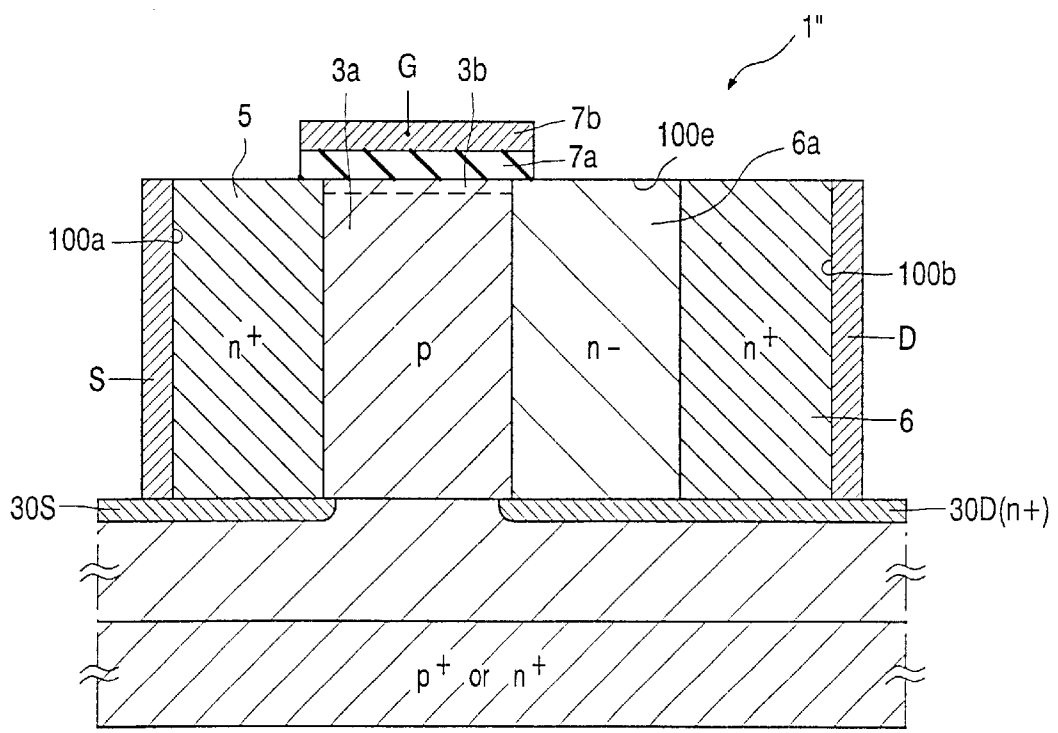
FIG. 11 shows a cross-sectional view similar to FIG. 9 of a modified version of the semiconductor device shown in FIG. 8.

FIG. 11 shows a cross-sectional view similar to FIG. 9 of a modified version of the device 1' shown in FIGS. 8 to 10. This device 1" differs from that shown in FIGS. 8 to 10 in that a drain drift region 6*a* is provided between the body and drain regions 3*a* and 6 to provide a high voltage device. Such a drain drift region may also be provided in the device 1 shown in FIGS. 1 to 7.

The devices 1' and 1" shown in FIGS. 8 to 11 may be manufactured using conventional semiconductor processing techniques.

Providing the field effect device as a mesa structure with the source and drain electrodes S and D contacting the walls of the mesa structure enables the mesa structure to be relatively high while still achieving good contact to the source and drain regions, so allowing a large increase in gate width enabling a low on-resistance (Rdson) and good current carrying capabilities and gain to be achieved, without detrimentally increasing source or drain resistance. For example, the mesa structure may have a height of 2.3 micrometers ($\mu$m), a width W of 2.3 micrometers and a length L of 6 micrometers.

Figure 12:
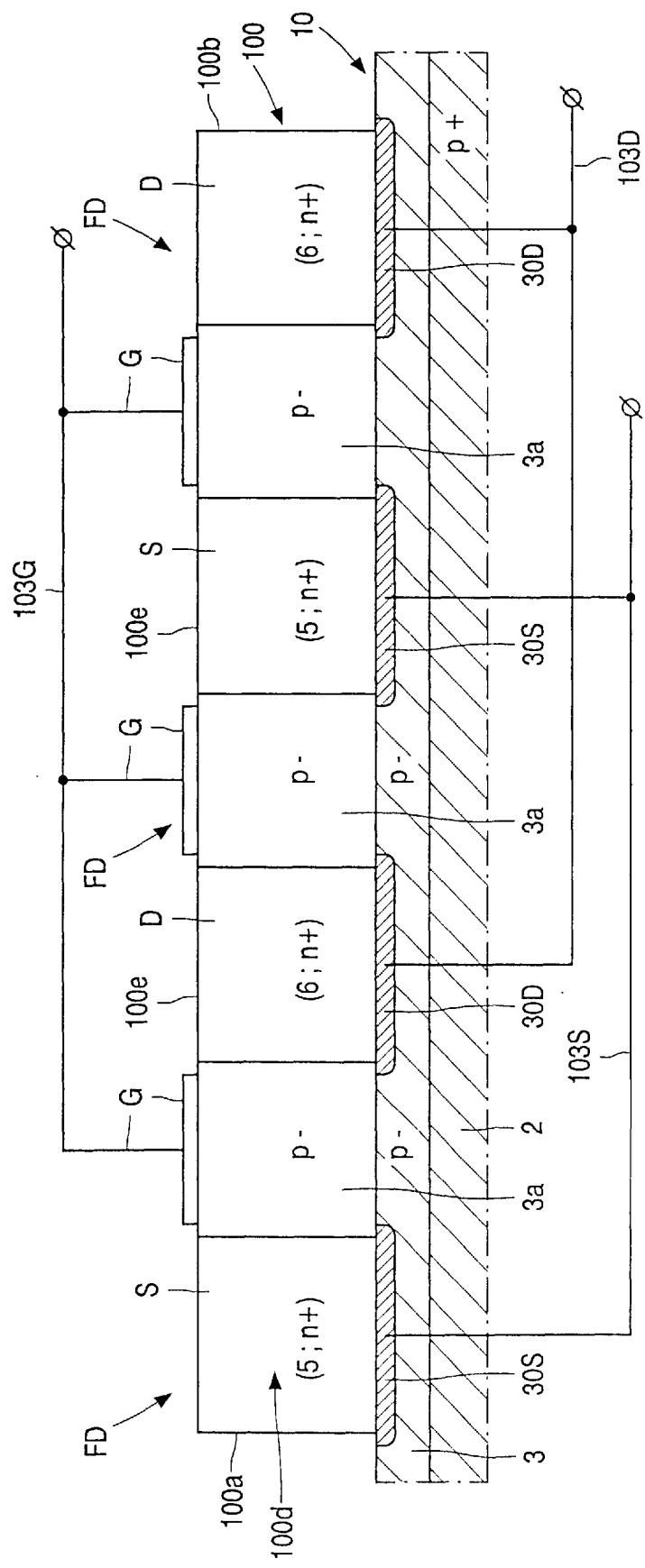
FIG. 12 shows a part-sectional side elevational view similar to that of FIG. 2, but of an embodiment of a semiconductor device in accordance with the invention that comprises a plurality of the field effect devices in the mesa structure.

FIG. 12 shows an embodiment in which the mesa structure 100 is a stripe. A series of alternating source and drain regions 5 and 6 are provided along the length of this mesa stripe, so forming respective field effect devices FD. The respective field effect devices FD are connected in parallel to provide a higher power, cellular device, of which each device FD constitutes a cell. Thus, the source regions 5 are connected in parallel by extensions of the source electrodes S and/or extensions of the regions 30S and/or by additional connection tracks or wires 103S. The drain regions 6 are connected in parallel by extensions of the electrodes D and/or extensions of the regions 30*d* and/or by additional connection tracks or wires 103D, The gates 7 are connected in parallel by extensions of the electrodes G and/or by additional connection tracks or wires 103G. FIG. 12 shows only three such paralleled devices FD in the mesa stripe 100, although in a power device there may be several tens or hundreds of such devices FD.

Figure 13:
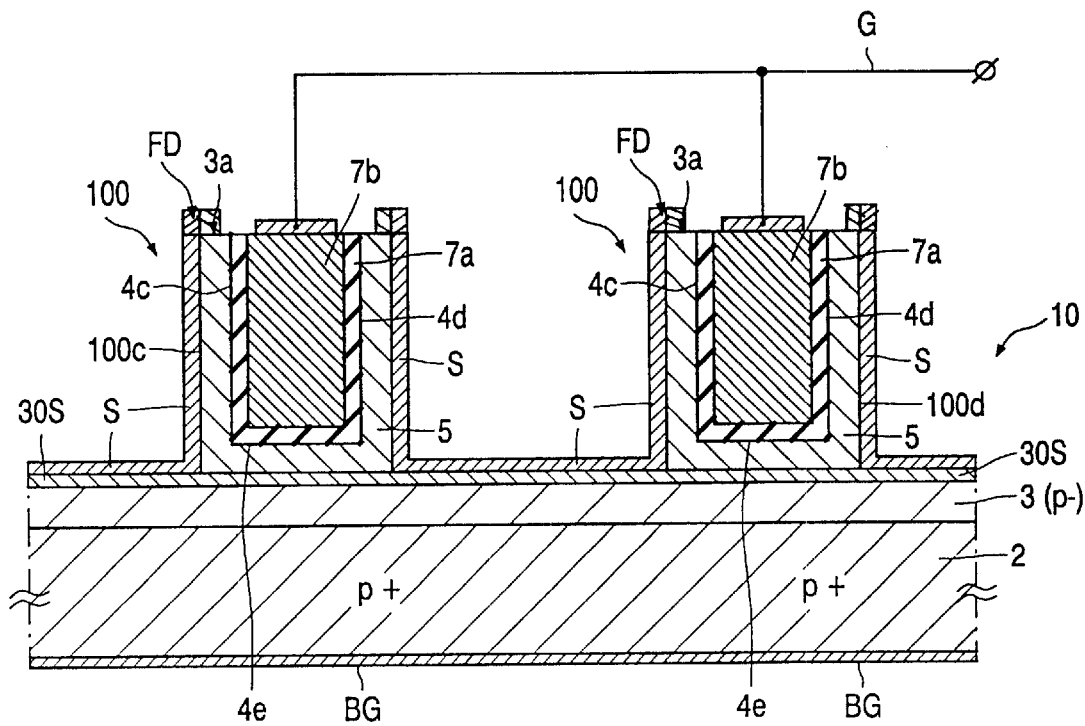
FIG. 13 shows a cross-sectional view similar to that of FIG. 3, but of an embodiment of a semiconductor device in accordance with the invention that comprises a side-by-side plurality of the mesa structures.
Figure 14:
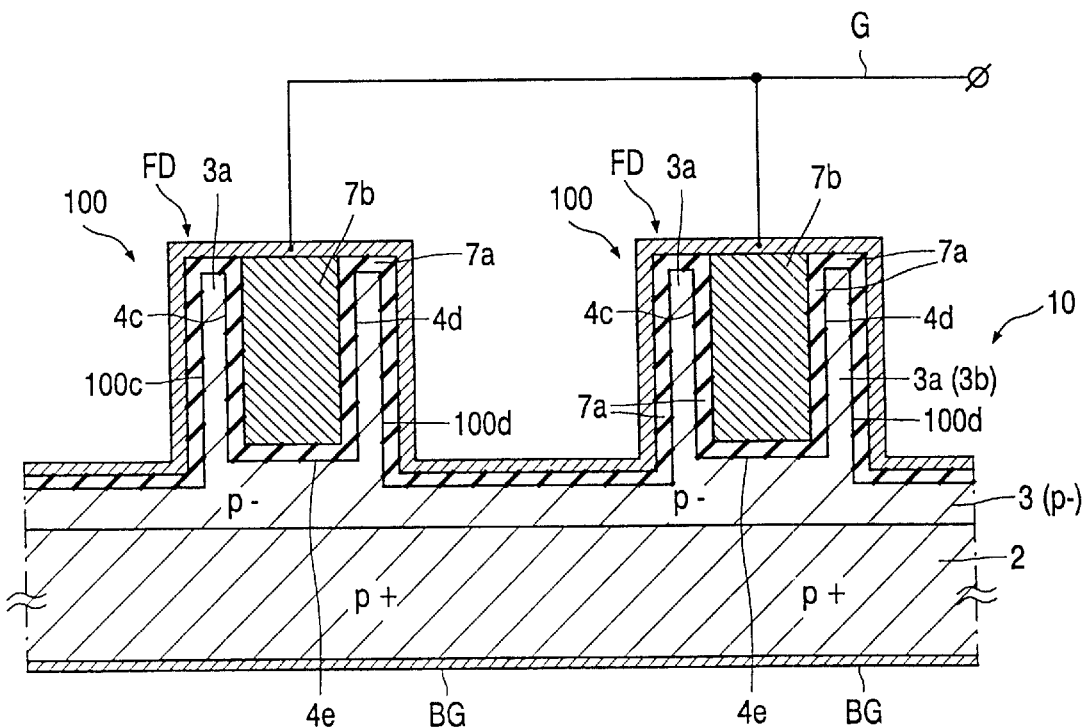
FIG. 14 shows a parallel cross-sectional view of the semiconductor device of FIG. 13, taken through the channel areas of the mesa structures.

The total semiconductor device may comprise a plurality of the mesa structures 100 (e.g. the mesa stripes 100 of FIG. 12) located side-by-side. The field effect devices FD of the different mesa stripes 100 can be connected in parallel to provide a higher power, cellular device, of which each device FD constitutes a cell. FIGS. 13 and 14 show two such mesa structures 100, although in a power device there may be, for example, many tens of the mesa stripes 100, side-by-side on the substrate 2. The source regions 5 of the different mesa stripes 100 are connected in parallel by extensions of the source electrodes S and/or extensions of the regions 30S and/or by additional connection tracks or wires 103S. The drain regions 6 are similarly connected in parallel by extensions of the electrodes D and/or extensions of the regions 30*d* and/or by additional connection tracks or wires 103D, The gates 7 are connected in parallel by extensions of the electrodes G and/or by additional connection tracks or wires 103G. FIG. 14 illustrates an extension of the gate electrode G on an extension of the gate dielectric 7*a* on the side walls 100*c* and 100*d* in a similar manner to the gate side-wall extension in FIG. 10. However, unlike the device of FIGS. 8 to 10, the device of FIGS. 13 and 14 also has its gate structure in a trench 4 within the mesa structure 100. Instead of using the gate electrode G to provide the side-wall extension of the gate, areas of the conductive portion 7*b* (e.g. doped polycrystalline silicon) may be used on the gate dielectric 7*a* on the side walls 100*c* and 100*d*.

In the trench-gate devices of FIGS. 12 to 14, the side walls 100*c* and 100*d* of the mesa structure (with source and drain regions 5 and 6) that are contacted by the source and drain electrodes S and D (over their whole depth) can be deeper than the side walls 4*c* and 4*d* of the gate trench (and so deeper than the depth of the conduction channel controlled by the gate). Thus, as in the device of FIGS. 1 to 3, a more uniform current flow can be achieved from the conduction channel to the source and drain regions and electrodes, so reducing the spreading resistance. However, the trenches 4 in the multiple mesa stripes 100 could be formed with the same depth as the side walls 100*c* and 100*d* of the mesa stripes 100, and the spacing between the mesa stripes 100 could be the same as the width of the gate trench 4. In this case, the spacing between the mesa stripes 100 could be filled with the insulated gate structure 7*a* and 7*b* in the same way as the gate trench 4.

Each device FD in the trench-gate embodiments of FIGS. 12 to 14 may have its own individual trench 4 for its own insulated gate structure 7*a* and 7*b*. However a single trench 4 may extend through the series of source and drain regions 5 and 6 in the mesa stripe of FIG. 12. A single common gate structure 7*a* and 7*b* may then be present in this single trench 4. In this case, the gate structure 7*a* and 7*b* is surrounded by the source and drain regions 5 and 6 at the ends of the single trench 4 and also at a series of locations spaced along the single trench 4.

In the embodiments described with reference to FIGS. 1 to 3 and FIGS. 12 to 14, the mesa structure 100 and the gate trench 4 have the same shape. This need not necessarily be the case.

The mesa structure 100 and/or trench 4 may have a shape other than rectangular, for example trapezoidal, triangular or ellipsoidal shapes may be used.

It will, of course, be appreciated that the present invention may also be applied where the conductivity types given above are reversed. Furthermore, semiconductor materials other than silicon may be used such as germanium or germanium silicon alloys.

Also, the field effect transistor described above is a normally off or enhancement mode device. However, the present invention may be applied to normally on or depletion mode devices, in which case at least the part of the body region 3a defining the channel accommodating portion will be of the same conductivity type as the source and drain regions 5 and 6. The present invention may also be applied to MESFETs as well as to insulated gate field effect devices. In addition, the field effect device may be, for example, an insulated gate bipolar transistor where the drain region is of the opposite conductivity type to the source region. The invention may also be applied to devices having Schottky source regions.

In the above described examples, the p conductivity type epitaxial layer 3 on which the mesa structure is supported enables a good breakdown voltage to be achieved. This layer 3 may also be used to enable a back gate connection by providing a metal layer on the layer 3 away from the mesa structure.

In the above description, the mesa structure 100 is supported on a p conductivity type semiconductor substrate 2. However the substrate may be of n conductivity type. Also, the mesa structure 100 may be supported on an insulating substrate so as to provide a semiconductor on insulator (SOI) structure, in which case a back gate connection may be made away from the actual structure of the field effect device or unit cell.

In the trench-gate embodiments of FIGS. 1 to 3 and FIGS. 12 to 14, the gate structure 7a, 7b extends from one end of the trench 4 to the other. This need not be the case. FIG. 1 illustrates a uniform thickness for the gate dielectric layer 7a in the different areas of the trench 4. However, in order to reduce the gate-source and gate-drain capacitances, a greater thickness for the gate dielectric layer 7a (and/or even a different dielectric material) may be used where the gate structure 7a and 7b is bounded by the source and drain regions 5 and 6. Thus, this different structure for the gate dielectric layer 7a may be adopted (i) at the ends of the trench 4 in the embodiments of FIGS. 1 to 3 and 12 to 14, and (ii) at the series of source/drain locations spaced along a single trench 4 in the embodiments of FIGS. 12 to 14. However the trench-gate structure 7a and 7b need not be surrounded by the source and drain regions. All that is required in each of the above described embodiments is that the conductive gate region 7b covers the channel area. Also, in the trench-gate embodiments shown, the conductive gate region 7b substantially fills the trench providing the advantage of providing a planar surface. However, in some circumstances the conductive gate region 7b need not substantially fill the trench but could be a relatively thin layer following the trench contour as described in U.S. Pat. No. 4,835,584.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. A semiconductor device comprising a semiconductor body comprising a field effect device, the semiconductor body having source and drain regions spaced apart by a body, region, the field effect device having a gate structure for controlling a conduction channel in a conduction channel accommodating portion of the body region between the source and drain regions, wherein the field effect device comprises a mesa structure having end walls and side walls, the source and drain regions meet respective end walls and part of the side walls of the mesa structure, source and drain electrodes contact the source and drain regions respectively along a depth of the walls of the mesa structure, the body region extends between and meets the side walls of the mesa structure, and the gate structure extends along and between the side walls such that the conduction channel accommodating portion extends along and between the side walls.

2. A semiconductor device according to claim 1, wherein the gate structure is provided within a trench in the mesa structure.

3. A semiconductor device according to claim 2, wherein the gate structure has first and second end regions in the trench that are surrounded by source and drain regions respectively.

4. A semiconductor device according to claim 2, wherein the trench has first and second end walls connected by side walls, and respective source and drain regions are provided at opposite ends of the trench such that the source region extends along part of one trench side wall adjacent the first trench end wall, along the first trench end wall and along part of the other trench side wall adjacent the first trench end walls and the drain region extends along part of one trench side wall adjacent the second trench end wall, along the second trench end wall and along part of the other trench side wall adjacent the second trench end wall.

5. A semiconductor device according to claim 2, wherein the gate structure extends from one trench end wall to the other.

6. A semiconductor device according to claim 2, wherein the gate structure has a conductive gate region that substantially fills the trench.

7. A semiconductor device as claimed in claim 1, wherein the walls of the mesa structure have a depth that is deeper than the walls of the trench in which the gate structure is provided.

8. A semiconductor device according to claim 7, wherein the gate structure and the source and drain electrodes extend from the mesa structure onto a support region supporting the mesa structure.

9. A semiconductor device as claimed in claim 1, wherein the source and drain electrodes contact the source and drain regions over the whole depth of the walls of the mesa structure.

10. A semiconductor device as claimed in claim 1, wherein a series of alternating source and drain regions is provided along the length of the mesa structure to form respective field effect devices that are connected in parallel to provide a higher power device.

11. A semiconductor device as claimed in claim 1, and comprising a plurality of the mesa structures located sideby-side, with the field effect devices of the respective mesa structures connected in parallel to provide a higher power device.

12. A semiconductor device according to claim 1, wherein the gate structure extends on top of and over the side walls of the mesa structure.

13. A semiconductor device according to claim 1, wherein the source and drain electrodes extend along each surface of the source and drain regions, respectively, that forms part of the exposed surface area of the mesa structure 14. A semiconductor device according to claim 1, wherein the gate structure comprises an insulated gate structure.

15. A semiconductor device comprising a field effect device formed as a mesa structure with source and drain regions at opposite ends of a trench formed in the mesa structure, a gate structure provided within the trench on bottom and side walls of the trench to control a conduction channel between the source and drain regions, and source and drain electrodes that extend along and contact a depth of the source and drain regions.

16. A semiconductor device comprising a semiconductor body that comprises a field effect device, wherein the semiconductor body comprises source and drain regions spaced apart by a body region, and wherein the field effect device comprises:

a gate structure for controlling a conduction channel in a conduction channel accommodating portion of the body region between the source and drain regions;

a mesa structure having end walls and side walls, wherein the source and drain regions meet respective end walls and part of the side walls of the mesa structure, and wherein the gate structure extends along and between the side walls such that the conduction channel accommodating portion extends along and between the side walls; and source and drain electrodes contacting the source and drain regions along a depth of the source and drain regions.

17. The semiconductor device of claim 16, wherein the gate structure is provided within a trench in the mesa structure, wherein the trench has end walls and side walls, and wherein the source and drain regions contact respective end walls of the trench.

18. The semiconductor device of claim 17, wherein the gate structure comprises a conductive region that substantially fills a volume of the trench.

19. The semiconductor device of claim 16, wherein the gate structure extends on top of and over the side walls of the mesa structure.

20. The semiconductor device of claim 16, wherein the gate structure and the source and drain electrodes extend from the mesa structure onto a support region supporting the mesa structure.

* * * * *